United States Patent [19]
Huijser

[11] Patent Number: 5,905,408
[45] Date of Patent: May 18, 1999

[54] AMPLIFIER AND A METHOD FOR DETECTING THE PRESENCE OF A LOAD

[75] Inventor: Jan P. F. Huijser, Nijmegen, Netherlands

[73] Assignee: U.S. Philips Corporation, New York, N.Y.

[21] Appl. No.: 08/890,461

[22] Filed: Jul. 9, 1997

[30] Foreign Application Priority Data

Aug. 9, 1996 [EP] European Pat. Off. .............. 96202250

[51] Int. Cl.⁶ ...................................................... H03F 1/14
[52] U.S. Cl. ............................................ 330/51; 330/146
[58] Field of Search .................................. 330/2, 51, 146, 330/298, 207 P

[56] References Cited

U.S. PATENT DOCUMENTS

| | | | |
|---|---|---|---|
| 3,990,020 | 11/1976 | Porter, III | 330/207 P |
| 4,330,756 | 5/1982 | Moreau | 330/51 |
| 5,101,170 | 3/1992 | Torazzina et al. | 330/51 |
| 5,708,390 | 1/1998 | Dunnebacke | 330/51 |

FOREIGN PATENT DOCUMENTS

0446945A2  9/1991  European Pat. Off. .......... H03F 1/52

*Primary Examiner*—Robert Pascal
*Assistant Examiner*—Patricia Nguyen
*Attorney, Agent, or Firm*—Steven S. Rubin

[57] ABSTRACT

An amplifier and a method for detecting the presence of a load (3) in a bridge-type amplifier configuration, in which the amplifier includes two amplifying circuits (1, 2). A load detection sequence is combined with an activation sequence of the amplifier by providing, during activation of the first amplifying circuit (1), a low impedance (4) at the output (203) of the second amplifying circuit (2), and determining whether a current flows through the low impedance (4) or one of the outputs (103, 203) of the amplifying circuits (1, 2) during the activation of the first amplifying circuit (1).

13 Claims, 2 Drawing Sheets

AMPLIFIER AND A METHOD FOR DETECTING THE PRESENCE OF A LOAD

BACKGROUND OF THE INVENTION

1. Field of the Invention

The invention relates to an amplifier comprising first amplifying means and second amplifying means for supplying an amplified input signal to a load connected between outputs of the first and second amplifying means.

The invention further relates to a method for detecting the presence of a load coupled between an output of a first amplifying means and an output of a second amplifying means.

1. Description of the Related Arts

Such an amplifier is known from European Patent Application EP-A 446945. The known amplifier comprises means for effectuating a separate load detection sequence, during which sequence both amplifying means are disabled. These means further comprise a constant current source for providing a bias for the load detection and further control circuitry for performing the load detection. This renders the amplifier rather complex.

SUMMARY OF THE INVENTION

An object of the invention is to provide an amplifier having a simple load detection.

The amplifier according to the invention is characterized in that the amplifier further comprises:

control means for activating the first amplifying means, means for providing a low impedance at the output of the second amplifying means during a predetermined period of time following the activation of the first amplifying means, and means for determining whether a current flows through at least one of the outputs during at least a part of the predetermined period of time.

The invention is based on the recognition that an activation sequence of an amplifier can be used advantageously for simultaneously performing a load detection. In this way, no separate means are required to provide a bias for the load detection. As the load detection is performed during the activation of the amplifier, hardly any additional control circuitry is necessary, as most of this control circuitry is already present for the activation of the amplifier. By providing a low impedance at one end of a connection of a load, a well-defined current will start to flow upon activation of the first amplifying means without the need for a constant current source or the like. By determining whether a current flows through one of the outputs of the amplifier during at least a part of the predetermined period of time, the presence or absence of a load can be established.

An embodiment of the amplifier, according to the invention, is characterized in that the determining means are arranged for measuring a current flowing through an output of at least one of the amplifying means or the means for providing a low impedance. The current flowing through one of the outputs can be measured not only at the outputs of the amplifying means themselves, but also at the means for providing the low impedance path, as the current flowing through the load will necessarily also flow through the means for providing the low impedance.

An embodiment of the amplifier, according to the invention, is characterized in that the means for providing a low impedance comprises a transistor and means for biasing said transistor. This provides a simple implementation of the means for providing a low impedance.

An embodiment of the amplifier, according to the invention, is characterized in that the biasing means is arranged for gradually releasing the low impedance after said predetermined period of time. By gradually releasing the low impedance the current through the load will decrease gradually. In this way sharp voltage changes across the load are avoided and no audible noise will be produced during said release.

An embodiment of the amplifier, according to the invention, is characterized in that the transistor is an output transistor of the second amplifying means. By using the same transistor for both signal amplification and providing a low impedance, no extra transistor is needed for providing the low impedance.

An embodiment of the amplifier, according to the invention, is characterized in that the means for measuring the current is arranged for integrating the measured current. By integrating the measured current, the result of the measurement becomes less susceptible to short-duration fluctuations in the measured current. This leads to an increased reliability of the measurement.

An embodiment of the amplifier, according to the invention, is characterized in that the predetermined period of time lasts for several hundreds of milliseconds. By making the length of the measuring interval stretch over several hundreds of microseconds, again, the measurement is made more reliable as short fluctuations will hardly affect the outcome of the measurement.

BRIEF DESCRIPTION OF THE DRAWINGS

The above object and features of the present invention will be more apparent from the following description of the preferred embodiments with reference to the drawings, wherein.

In the figures, identical parts are provided with the same reference numbers.

DESCRIPTION OF THE PREFERRED EMBODIMENTS

Figure 1:
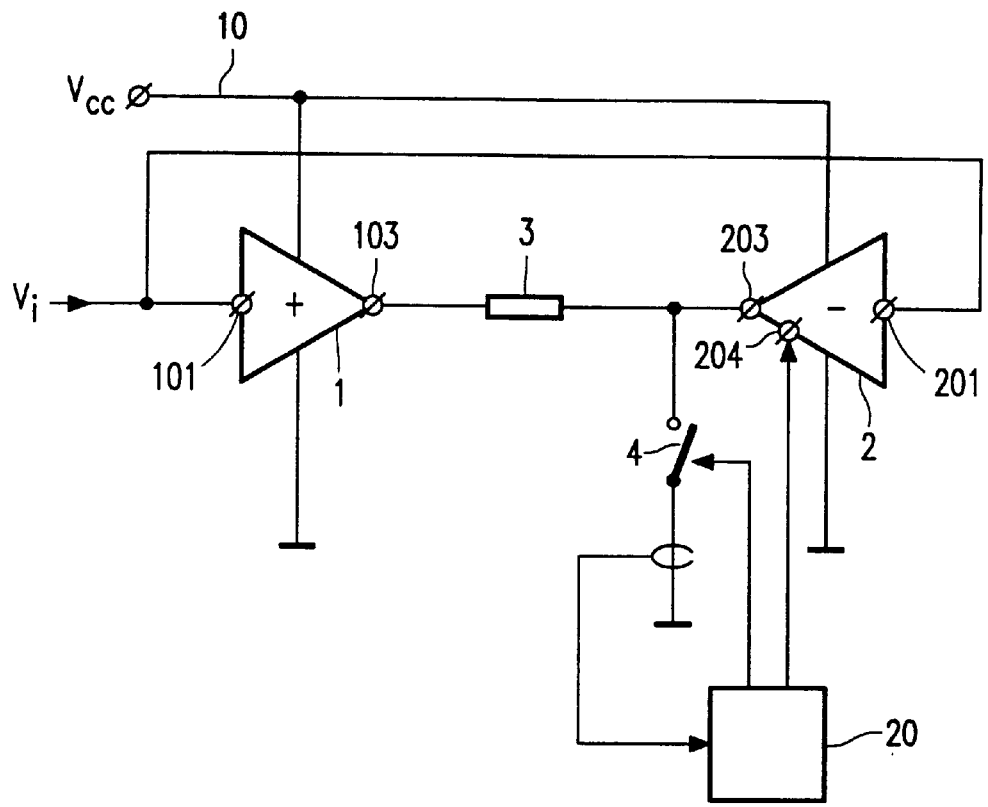
FIG. 1 shows a diagram of a first embodiment of an amplifier according to the invention.

FIG. 1 shows a diagram of a first embodiment of an amplifier according to the invention. The amplifier comprises first amplifying means 1 and second amplifying means 2 for driving a load 3 connected between their outputs 103 and 203. The first amplifying means 1 receives an input signal Vi at its input 101 and amplifies it without inverting it, and the second amplifying means 2 receives the input signal at its input 201 and amplifies it while inverting it. The first and second amplifying means 1, 2 receive a power supply voltage Vcc from line 10. The output 203 of the second amplifying means 2 is connected to the ground through a switch 4. The switch 4 provides, in a closed state, a low impedance path between the output 203 of the second amplifying means 2 and ground, and represents, in an opened state, an open circuit. The second amplifying means 2 can be enabled with an enable signal supplied to its enable input 204. The amplifier further comprises control means for supplying a switch enable signal to switch 4 and an amplifier enable signal to the second amplifying means 2. When power is applied to the amplifier, the control means 20 supplies an enable signal to the switch 4, thereby closing said switch 4, and no enable signal to the second amplifying means 2, which remains disabled. Now the output 103 of the first amplifying means will give an output voltage which gradually rises to its settling value, which is normally equal to Vcc/2. When a load 3 is present, a current will flow through the load 3 as a result of the closed switch 4. This current can be measured directly or indirectly. Indirectly, it can be measured either at the output 103 of the first amplifying means or at the output 203 of the second amplifying means 2 or even at the switch 4 itself. Thus a current is measured which is representative of the current through the load. The measured current is then supplied to the control means 20 for evaluation. If this current exceeds a predetermined value it can be assumed that a load 3 is present. If the current does not exceed this value it can be assumed that no load is present. In general, by detecting whether a current flows through one of the outputs 103 or 203, it can be determined whether or not a load 3 is present. When the first amplifying means 1 has settled to its settling value, the switch 4 may be opened and the second amplifying means 2 enabled. Now the amplifier is ready for normal operation. In the present invention, the load detection sequence is part of the activation sequence of the amplifier. This means that no separate load detection sequence is needed and hardly any extra components are needed for the load detection. The resulting detection information can be used for various purposes, for example, diagnostics, setting the configuration of the amplifier, automatic shut-off when no load is present, etc. From FIG. 1, it follows that by combining the activation sequence and the load detection sequence, according to the present invention, in an amplifier having an activation sequence in which the first and second amplifying means are sequentially activated, only few components need be added to be able to realize the load detection, such as: current detection means and means for providing a low impedance. In this way, a simple but effective load detection can be realized at little extra cost.

Figure 2:
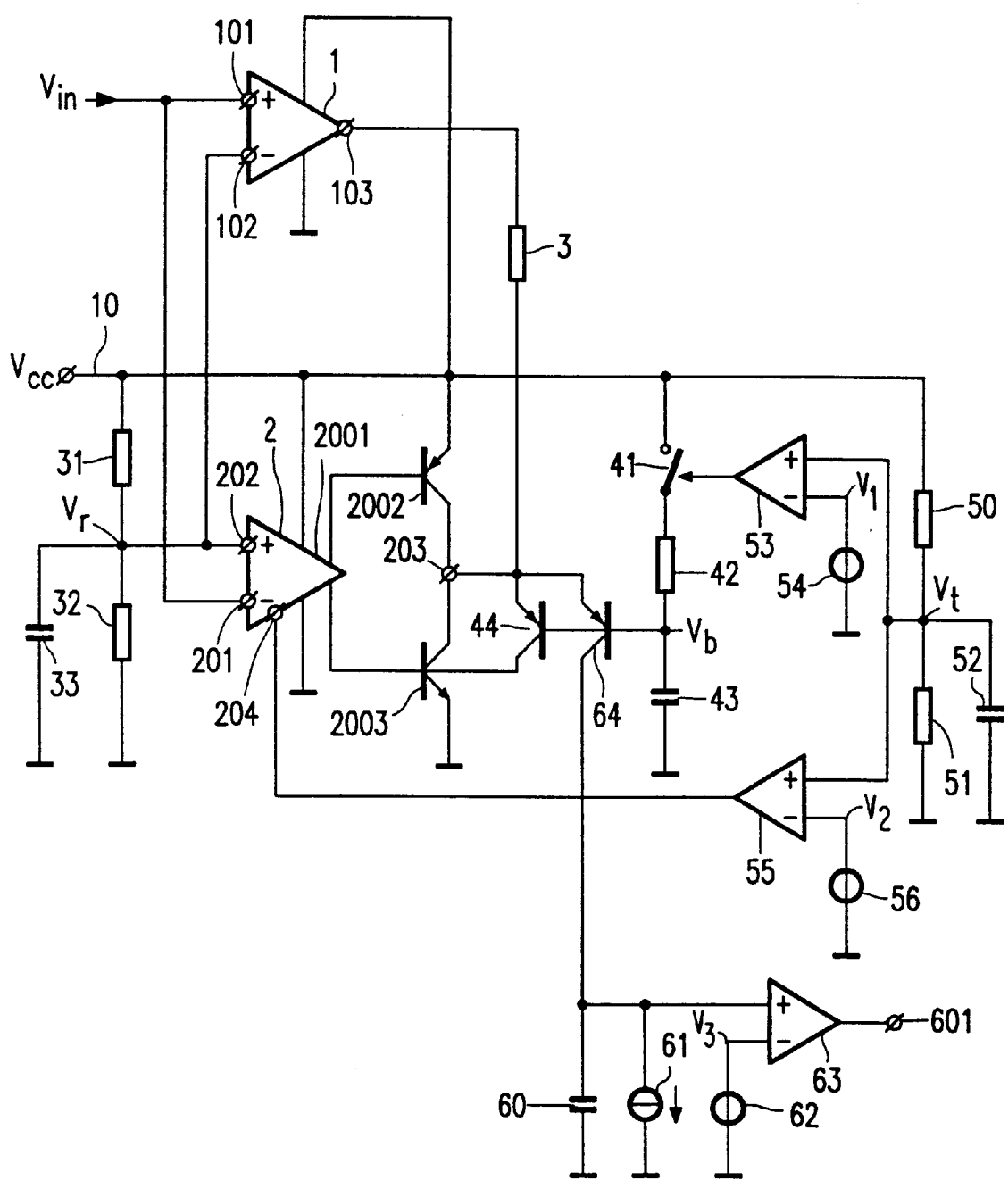
FIG. 2 shows a diagram of a second embodiment of an amplifier according to the invention.

FIG. 2 shows a diagram of a second embodiment of an amplifier according to the invention. First amplifying means 1 includes a non-inverting signal input 101, an inverting reference input 102 and an output 103. The reference input 102 is coupled to reference voltage supply means for receiving a reference voltage Vr. The reference voltage supply means comprises resistors 31 and 32 placed in series between line 10 and ground, and a capacitor 33 placed in parallel with resistor 32. The common node of resistors 31 and 32 is then coupled to the reference input 102. The second amplifying means 2 comprises an amplifying stage 2001 having an inverting signal input 201 connected to the signal input 101, and a non-inverting reference input 202 connected to the reference input 102 of the first amplifying means 1. The second amplifying means 2 further comprises a cascade of two complementary output transistors 2002 and 2003, which are driven by respective outputs of the amplifying stage 2001. The output transistors 2002 and 2003 have their collectors mutually coupled, thereby forming the output 203. NPN output transistor 2003 performs a dual function: during normal operation (i.e., the second amplifying means is enabled) it performs as a regular output transistor, but during the activation of the amplifier, it also functions as a means for providing a low impedance path from the output 203 to ground. For the latter purpose, biasing means are provided for biasing the output transistor 2003 during the activation sequence. The biasing means comprise a switch 41, resistor 42 and capacitor 43 placed in series between line 10 and the ground, the common connection of the resistor 42 and capacitor 43 being connected to the base of a PNP bias transistor 44 for supplying a bias voltage Vb. The bias transistor 44 has its collector connected to the base of output transistor 2003 and its emitter connected to the collector of the output transistor 2003. The current at output 203 during the activation sequence is indirectly measured by measuring the base current of output transistor 2003, which is supplied by bias transistor 44. For this purpose, a transistor 44 has its base and emitter connected to the base and emitter, respectively, of the bias transistor 64. Thus, at the collector of transistor 64, a copy is available of the current supplied by the bias transistor 44 to the base of the output transistor 2003. This current is used for charging a capacitor 60, this capacitor 60 thereby performing an integration of the current. A comparator 63 then compares the voltage across capacitor 60 with a predetermined voltage V3 supplied by voltage source 62, thereby generating a load detection signal indicating that a load is present when the capacitor voltage exceeds the value V3. A current source 61 is placed parallel to the capacitor 60 for compensating any quiescent currents running through output transistor 2003. Enable signals for switch 41 and amplifying stage 2001 are generated by timing or control means. The timing means comprises a series circuit of resistors 50 and 51, placed between line 10 and ground, a capacitor 52 placed parallel to resistor 52, comparators 53 and 55 for comparing the voltage Vt across capacitor 52 with respective predetermined voltages V1 and V2, supplied by respective voltage sources 54 and 56. Comparator 53 generates a first enable signal for enabling switch 41 if voltage Vt exceeds voltage V1 and comparator 55 generates a second enable signal for enabling amplifying stage 2001 if voltage Vt exceeds voltage V2, wherein V2>V1.

Figure 3:
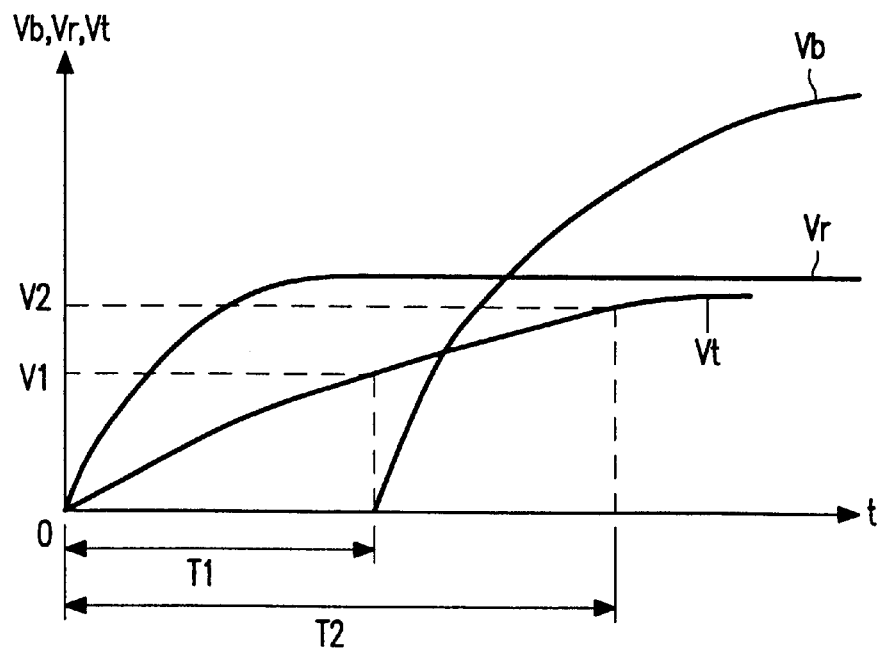
FIG. 3 is a graph showing the variation of voltages Vb, Vr and Vt versus time t.

FIG. 3 is a graph showing the variation of voltages Vb, Vr and Vt versus time t. A combined activation and load detection sequence, according to the invention, will now be described in more detail. When power is applied to line 10 at time t=0, capacitors 33 and 52 will be charged gradually to their respective end values, which are determined by the ratios of resistor pairs 31, 32 and 50, 51, respectively. However, capacitor 33 is charged faster than capacitor 52. As the output 103 of the first amplifying means 1 will follow the voltage Vr applied to its reference input 102, the voltage at the output 103 will rise gradually in a similar way as shown for curve Vr in FIG. 3. When a load 3 is present, the emitter-base junction of bias transistor 44 is forwardly biased and, as a result, output transistor 2003 will become conductive. In this way, output transistor 2003 provides a low impedance from output 203 to ground. After a predetermined time T1, the voltage Vt has reached a level equal to V1 and comparator 53 enables switch 41. This level V1 and, consequently, the time T1 is chosen such as to allow voltage Vr to reach a value which is close to its setting value. It is not necessary for voltage Vr to have reached its settling value at T1. By the closure of switch 41, the voltage Vb will increase gradually, starting from zero. This results in a decrease of the bias of the emitter-base junction of bias transistor 44, thereby reducing the current supplied to the base of output transistor 2003. This results in a gradual increase of the impedance of output transistor 2003, until the output transistor 2003 is eventually shut off. This happens when voltage Vb is close to or greater than voltage Vr. In this way, a gradual release of the low impedance is effectuated. Preferably, the release of the low impedance takes several hundreds of milliseconds. This results in a practically inaudible release of the low impedance as no sharp transients will occur across the load. After a predetermined time T2, when output transistor 2003 is already shut off, voltage Vt reaches level V2 and then comparator 55 enables the amplifying means 2001 for normal operation. In the meantime, voltage Vb may have reached its end value, although this is not strictly necessary. Preferably, the end value of voltage Vb is close to Vcc. This effectively prevents an accidental turn-on of bias transistor 44 during large signal excursions at the output 203. During the time that bias transistor 44 is forwardly biased, a copy of the bias current is used for charging capacitor 60. When, after time T2, the voltage across capacitor 60 exceeds the value of V3, the output 601 indicates that a load is present. From FIG. 3, it may be clear that the rise of the voltage at the output 103 is gradual and not abrupt. If the slope of this voltage does not exceed 100 V/s, no audible noise will be heard due to this voltage rise. Similarly, if the impedance of output transistor 2003 is increased only gradually, again, no audible noise will be generated. Preferably, the time T2 lasts several hundreds of milliseconds. By integrating the measured current over such a time, the current measurement is made more robust against short-duration variations in the current through the load. This is of special interest for applications in a car, whereby the closure of a door can cause a short-duration current to flow through a speaker due to the change in air pressure within the car. Furthermore, this measure allows the voltage slopes to become not too steep, resulting in an inaudible activation and load detection sequence. In the present invention, the relatively large measuring voltage across the load and, consequently, large current to be measured, the long measuring time and the integration of the measured current each contribute individually to a robust and reliable load detection. By combining the load detection sequence with the activation sequence, only few extra components are required for performing the load detection.

The invention is not limited the embodiments as described previously. The time interval during which the current is measured may be a part of time interval T1, encompass the whole of time interval T1 or even encompass the whole of time interval T2. The second amplifying means 2 can also be enabled by using a further switch, which, in an open state, interrupts power supplied to the second amplifying means 2 and, in a closed state, allows power to be supplied to the second amplifying means 2. Alternatively, the second amplifying means 2 need not have an enable input 204 at all. In this case, its output 203 can forcibly be kept at a low voltage during activation of the first amplifying means. In this way, the output 203 itself provides a low impedance from the output 203 to ground and no switch 4 is needed. This low voltage at the output 203 can be achieved, for example, by providing a voltage difference between the inputs 201 and 202 of sufficient magnitude to keep the output 203 at a low voltage, preferably close the ground voltage. It can also be achieved by applying a separate reference voltage to its reference input 202. During T1, this reference voltage should be low so that the output 203 will be low as well, since the output 203 will follow the voltage applied to the reference input 202. After T1 has elapsed, the reference voltage may increase gradually in a similar manner as voltage Vr. The output transistors of the second amplifying means 2 may be MOS transistors instead of bipolar transistors. Furthermore, the second amplifying means 2 may also be a buffer, in which case no signal input 201 is needed. Such an amplifier is known from U.S. Pat. No. 5,332,976. In general, the invention can be used in any amplifier having a bridge-like configuration. The reference voltage supply means and the timing means may be one and the same, as long as the first and second enable signals can be properly generated. In this case, elements 31, 32 and 33 can be deleted from FIG. 2 and the reference inputs 102 and 202 should be connected to the common node between resistors 50 and 51.

I claim:

1. An amplifier comprising first amplifying means and second amplifying means for supplying an amplified input signal to a load connected between outputs of the first and second amplifying means, characterized in that the amplifier further comprises:

means for activating the first amplifying means;

means for providing a low impedance at the output of the second amplifying means during a predetermined period of time following the activation of the first amplifying means; and means for determining whether a current flows through at least one of the outputs of the first and second amplifying means during at least a part of the predetermined period of time.

2. The amplifier of claim 1, characterized in that the determining means comprises means for measuring a current flowing through an output of at least one of the first and second amplifying means or the means for providing a low impedance.

3. The amplifier of claim 1, characterized in that the means for providing a low impedance comprises a transistors and means for biasing said transistor.

4. The amplifier of claim 3, characterized in that the biasing means comprises means for gradually releasing the low impedance after said predetermined period of time.

5. The amplifier of claim 3, characterized in that the transistor is an output transistor of the second amplifying means.

6. The amplifier of claim 2, characterized in that the means for measuring the current comprises means for integrating the measured current.

7. The amplifier of claim 1, characterized in that the predetermined period of time lasts for several hundreds of milliseconds.

8. A method for detecting the presence of a load coupled between an output of a first amplifying means and an output of a second amplifying means, characterized in that said method comprises the steps:

activating the first amplifying means;

providing a low impedance path at the output of the second amplifying means for a predetermined period of time following the activation of the first amplifying means; and determining whether a current flows through at least one of the outputs of the first and second amplifying means during at least a part of the predetermined period of time.

9. The amplifier of claim 2, characterized in that the means for providing a low impedance comprises a transistor, and means for biasing said transistor.

10. The amplifier of claim 9, characterized in that the biasing means comprises means for gradually releasing the low impedance after said predetermined period of time.

11. The amplifier of claim 4, characterized in that the transistor is an output transistor of the second amplifying means.

12. The amplifier of claim 9, characterized in that the transistor is an output transistor of the second amplifying means.

13. The amplifier of claim 10, characterized in that the transistor is an output transistor of the second amplifying means.

* * * * *